United States Patent [19]

Kessler et al.

[11] Patent Number: 4,630,669
[45] Date of Patent: Dec. 23, 1986

[54] HEAT EXCHANGE APPARATUS FOR HIGH TEMPERATURE LPCVD EQUIPMENT

[75] Inventors: Peter H. Kessler; Wilson D. Calvert, Sr., both of Round Rock; Faivel S. Pintchovski, Austin, all of Tex.

[73] Assignee: Motorola, Inc., Schaumburg, Ill.

[21] Appl. No.: 765,640

[22] Filed: Aug. 15, 1985

[51] Int. Cl.[4] ............................................. F28F 3/12
[52] U.S. Cl. ........................................ 165/1; 165/47; 165/169; 219/10.49 R; 277/22
[58] Field of Search ............................ 165/47, 169, 1; 219/10.49 R; 373/140, 141, 154; 277/22; 285/41

[56] References Cited

U.S. PATENT DOCUMENTS

| | | | |
|---|---|---|---|
| 4,139,220 | 2/1979 | Faccou et al. | 277/22 |
| 4,293,755 | 10/1981 | Hill et al. | 219/10.49 R |
| 4,439,041 | 3/1984 | Schaeffer et al. | 165/47 |
| 4,468,549 | 8/1984 | Arnosky | 219/10.49 R |

FOREIGN PATENT DOCUMENTS 1290700  5/1961  France ............................ 165/169

OTHER PUBLICATIONS

Kern, et al., "Low Pressure Chemical Vapor Deposition for Very Large-Scale Processing-A Review," IEEE Trans. Elec. Dev., vol. Ed-26, No. 4, Apr. 1979, pp. 647-657.
Tedrow, et al., "Low Pressure Chemical Vapor Deposition of Titanium Silicide," Appl. Phys. Lett., 46(2), Jan. 15, 1985, pp. 189-191.
HD Special Products, Inc., "Vacuum End Caps" brochure.

Primary Examiner—William R. Cline
Assistant Examiner—Richard R. Cole
Attorney, Agent, or Firm—John A. Fisher; Jeffrey Van Myers; David L. Mossman

[57] ABSTRACT

A heat exchanger apparatus having two sleeves which fit together to seal a sinuous heat exchange fluid channel between them where the channel is open along its length prior to assembly. The sleeves may be made removable to permit easy cleaning of the heat exchange fluid channel. The heat exchange fluid channel may thus be directly cleaned along its entire length in contrast to conventional heat exchangers employing tubes, where the tube interior can be accessed only from the ends. In one embodiment, the channel has a rectangular cross-section to enhance the heat exchange capability of the apparatus.

4 Claims, 3 Drawing Figures

HEAT EXCHANGE APPARATUS FOR HIGH TEMPERATURE LPCVD EQUIPMENT

CROSS-REFERENCE TO RELATED APPLICATION

This application is referenced in U.S. patent application Ser. No. 765,631, filed of even date, which describes a selective titanium silicide formation process for integrated circuits conducted using LPCVD equipment possessing the heat exchange apparatus of this invention.

FIELD OF THE INVENTION

The invention relates to improvements in low pressure chemical vapor deposition (LPCVD) equipment used in integrated circuit processing, and more particularly relates to techniques and apparatus for cooling LPCVD equipment run at high temperatures.

BACKGROUND OF THE INVENTION

In the wafer processing schemes used in the semiconductor industry, LPCVD reactors are generally hot wall, reduced pressure reactors that consist of a quartz tube heated by a furnace, typically comprising infrared heating elements, with process gas introduced into one end and pumped out to a vacuum pump at the other end. Pressures in the reaction chamber are typically 0.25 to 2.0 Torr (30 to 250 Pa) with temperatures ranging between 300° and 700° C. and gas flows between 100 and 1000 std. $cm^3$/min. (sccm). The reactions of the gases at high temperatures and low pressures cause thin layers of materials with desirable properties to be deposited on the surfaces of silicon wafers placed within the LPCVD reactor.

Attempts have been made to run LPCVD equipment at temperatures above 700° C., but prolonged runs at these high temperatures rapidly deteriorates the silicone "O" rings in the end caps that seal either end of the quartz reactor tube. The O-rings come apart by drying and cracking due to the high temperatures.

This O-ring deterioration can occur in less than a day at processing temperatures higher than 700° C. causing extended down time of the LPCVD reactor tube and accompanying hold up of the wafer process flow. One approach to this problem has been to somehow cool down the end caps so that the O-rings will not become overheated. It is becoming increasingly important to run LPCVD reactors at higher temperatures due to the discoveries of new processes that run efficiently only at these higher temperatures.

One commercially available solution is an end cap that has a single pass of stainless steel tubing wrapped around the circumference or positioned in a loop on the end of the end cap. Such tubing is typically only spot welded to the end cap so that there are very few intimate contact points between the end cap and the tubing. While a heat exchange fluid, such as water, can do a very efficient job of cooling the tubing, the end cap itself is not cooled very well due to the indirect contact of the system.

The present inventors tried a number of approaches to solve the problem. A suggested improvement on the commercially available system was to add a "heat sink" compound or paste between the tubing and the end cap, such as a metal-filled epoxy. However, such a technique would have been rather messy and cumbersome to accomplish and may not actually have improved the heat transfer surface area appreciably. Another approach was to machine grooves into the outer circumference of the end cap for the tubing to lay in. However, then it was discovered that machining grooves that tubing would lay in and make intimate contact with the end cap was physically difficult. Still another idea was to wrap tubing around the end cap and slide a sleeve over the tubing to force better contact. Even this concept was physically awkward.

SUMMARY OF THE INVENTION

Accordingly, it is an object of the present invention to provide an apparatus and technique for the prevention of O-ring deterioration in the end caps of LPCVD reactors run at high temperatures and thereby maintain vacuum integrity.

Another object of the present invention is to provide water-cooled end caps for LPCVD reactors wherein the heat exchange to the cooling water is highly efficient.

Still another object of the invention is to provide a water-cooled end cap that is readily constructed and easy to install and use.

Yet another object of the present invention is to provide a water-cooled end cap for high temperature LPCVD equipment, in one embodiment, that can be readily disassembled for maintenance.

In carrying out these and other objects of the invention, there is provided, in one form, a heat exchange apparatus with a base sleeve having at least a first surface having a sinuous fluid channel formed therein extending between an inlet portion and an outlet portion. In addition, there is provided a cover sleeve having at least a first surface of substantially the same cross-section as that of the first surface of the base sleeve so as to substantially seal the fluid channel in an operative position of the sleeves. The cover sleeve also has an inlet port and an outlet port extending therethrough so as to align with the inlet and outlet portions, respectively, of the fluid channel in the operative position of the sleeves.

DETAILED DESCRIPTION OF THE INVENTION

Figure 1:
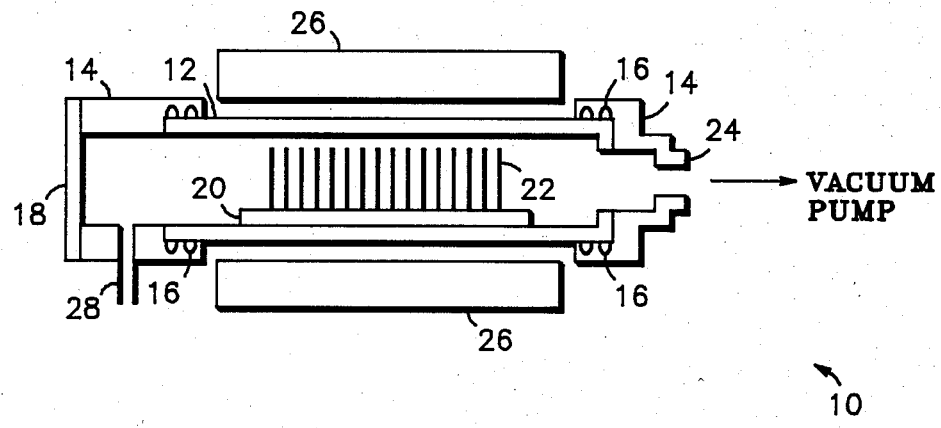
FIG. 1 is a schematic illustration of a LPCVD reactor showing the end caps on either end of the reactor tube.

Shown in FIG. 1 is a schematic illustration of a typical LPCVD reactor 10, which consists of a quartz tube 12, sealed by end caps 14 with the assistance of O-rings 16. The left end of the reactor 10 of FIG. 1 is provided with a load door 18 through which a boat 20 of wafers 22 may be inserted into the reactor 10 for processing. To aid in the chemical vapor deposition processing of the wafers 22, the reactor 10 is pumped down to the desired vacuum level via vacuum outlet 24 while the reactor 10 is heated via furnace heating elements 26 and process gases are introduced via gas inlet 28. As noted previously, when reactor 10 is run at unusually high temperatures (above 700° C.), the heat being provided by heating elements 26, O-rings 16 which provide the seal between the quartz tube 12 and the end caps 14 dry out and crack and must be replaced, sometimes as often as every other day. This problem causes considerable down time of the reactor 10 and delay of the wafer processing sequence.

Figure 2:
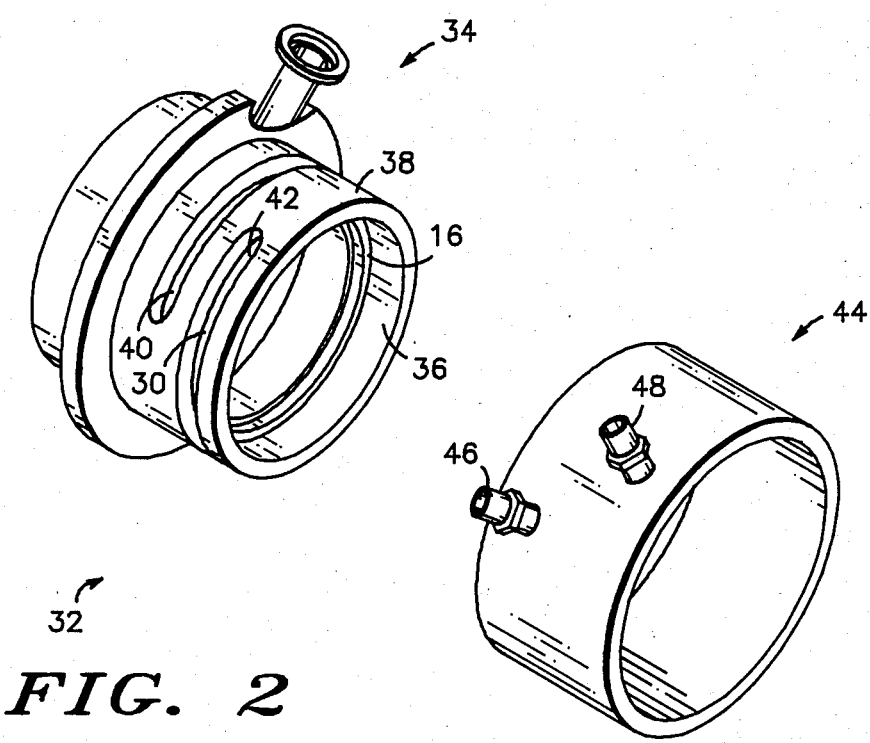
FIG. 2 is an exploded isometric illustration of one version of the water-cooled heat exchange apparatus of this invention.

According to the heat exchange apparatus of this invention, a heat exchange fluid channel 30 is directly machined, engraved or routed into the device from which heat is to be removed, such as end cap 32 or cover sleeve 44, to permit the circulation of a heat exchange fluid, as shown in FIG. 2. End cap 32 is composed of two primary parts, one being a cylindrical base sleeve 34 which has an inner cylindrical surface 36 and an outer cylindrical surface 38. One of the cylindrical surfaces is for contacting the area from which heat is to be removed, in this case the quartz tube of the LPCVD reactor, and the other cylindrical surface has formed within it at least one sinuous heat exchange fluid channel 30. Heat exchange fluid channel 30 is open to the outside along its entire length. In the case of the end cap shown in FIG. 2, the heat exchange fluid channel 30 is open on the outer side, that is, the side away from the heat source of the LPCVD quartz tube. The heat exchange fluid channel 30 has a beginning, inlet or inlet portion 40 and an end, outlet or outlet portion 42. It is not crucial to the operation of the heat exchange apparatus of this invention which end of the channel 30 is selected as the beginning 40 or the exit 42, as long as heat exchange fluid flow through channel 30 is maintained.

For improved heat exchange efficiency, it is preferred that heat exchange fluid channel 30 should make at least one circumnavigation of the cylindrical base sleeve 34 and preferably more than one circumnavigation. It is not important to the apparatus of the invention if the loops around the base sleeve 34 are in a particular configuration, or if loops around the sleeve are used at all, although a spiral pattern is suggested for space conservation reasons. Although only one channel 30 is shown in the heat exchange apparatus 32 of FIG. 2, it can be appreciated that in certain situations, more than one separate channel 30 may be desired to increase the heat exchange efficiency of the system.

The other primary part of heat exchange apparatus 32 is a cylindrical cover sleeve 44 for fitting snugly over the cylindrical surface having formed within it the heat exchange fluid channel 30, to seal off the channel from the outside and also to seal off the various loops or circumnavigations of the channel 30 from each other. In the embodiment illustrated in FIG. 2, the cylindrical cover sleeve 44 is adapted to fit over the outer cylindrical surface 38 of cylindrical base sleeve 34. However, if channel 30 were on the inner cylindrical surface 36 of the cylindrical base sleeve 34, the cylindrical cover sleeve 44 could be designed to fit snugly within the inner cylindrical surface 36.

Cylindrical cover sleeve 44 also possesses heat exchange fluid inlet port 46 and heat exchange fluid outlet port 48 which completely pierce the cylindrical cover sleeve 44 and are designed to correspond to and register with the beginning 40 and end 42 of heat exchange fluid channel 30 in the base sleeve 32, when the two parts are in the operative position. Inlet port 46 and outlet port 48 permit the heat exchange fluid to be circulated in the heat exchange apparatus 32 once cover sleeve 44 is affixed to base sleeve 34.

Cover sleeve 44 may be permanently welded on base sleeve 34 to provide a permanently single unit heat exchange apparatus 32. Another technique that may be employed is to use tight tolerances on the cross-sections of the mating surfaces of the sleeves, and then heat the outer sleeve and cool the inner sleeve and allow the sleeves to come to ambient temperature together to form tight fit. Or, alternatively, cover sleeve 44 may be removably fixed on base sleeve 34 by bolts, machine screws or other fastening means so that the cover sleeve 44 may be periodically removed for cleaning heat exchange channel 30 in instances where channel 30 may become blocked or fouled with contaminants or deposits along the walls of channel 30. It will be appreciated that because of the unique design of the heat exchange apparatus 32 that with a removable cover sleeve 44, the cleaning of channel 30 is extremely easy since channel 30 would be exposed and open along its entire length. This situation is in contrast to conventional heat exchangers comprised of tubing where the tubing interior can be accessed only from one or the other end of the tube.

Figure 3:
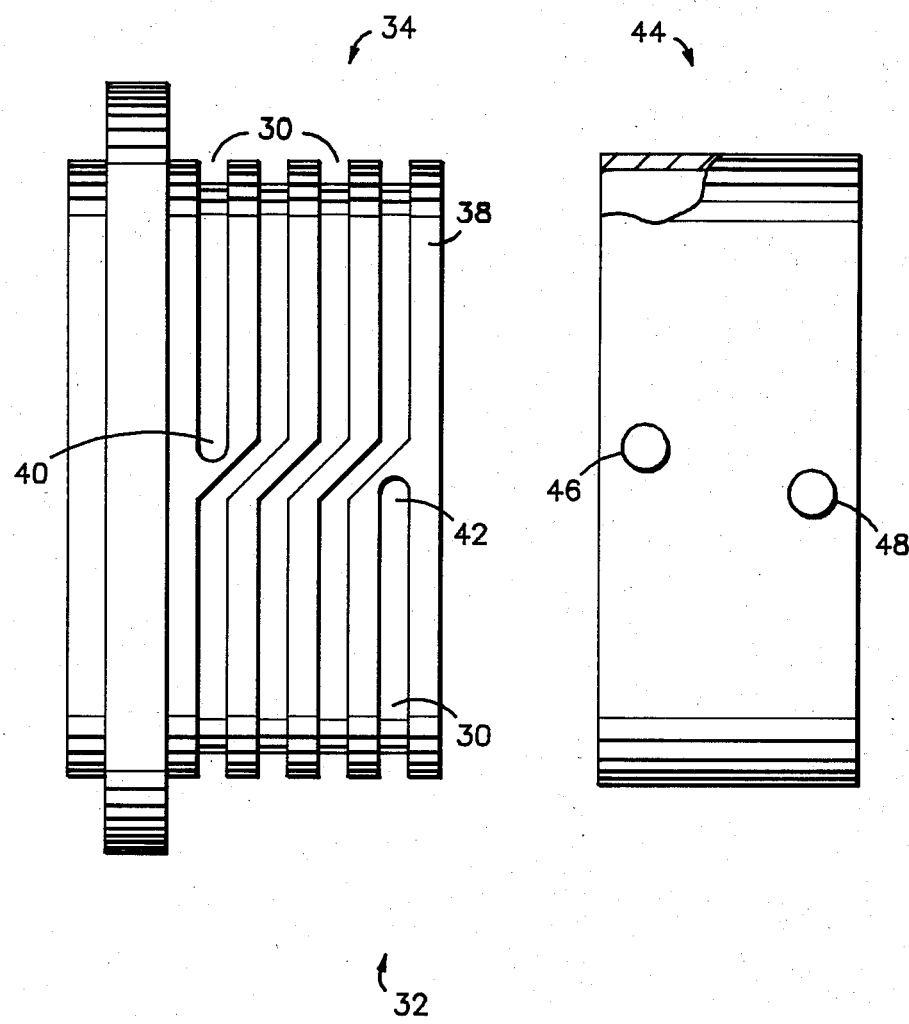
FIG. 3 is a top view of another version of the heat exchanger apparatus of this invention for high temperature LPCVD reactors.

Shown in FIG. 3 is another version of the heat exchange apparatus 32 as seen in an exploded view from the top. The same reference numbers used in FIG. 2 are used in FIG. 3 for ease in understanding. It may be seen from FIG. 3 that the heat exchange fluid channel 30 makes four loops or circumnavigations of cylindrical base sleeve 34 in a modified spiral pattern. A more true spiral design would, of course, be acceptable. The version of the heat exchange fluid channel 30 seen in FIG. 3 suggests one method of construction of the heat exchange apparatus 32, namely to mill or cut out circular sections of channel 30 and link them together with diagonal portions to form a spiral. This technique of manufacture demonstrates another optional feature of the present invention, namely a heat exchange fluid channel 30 with a rectangular cross-section, particularly where the rectangular cross-section has a long side and a short side and the long side is parallel to the cylindrical surface, in particular the surface from which the heat is to be removed. This affords a particularly intimate contact of the heat exchange fluid with the area from which heat is to be removed which cannot be achieved with a round or circular cross-section.

It will also be appreciated that although the invention has been described in terms of removing heat from a hot zone, such as a high temperature LPCVD reactor, that the heat exchange apparatus of this invention can also be used for adding heat to a cold area with equal efficiency. The other advantages of the invention are also readily apparent, such as improved heat exchange efficiency due to the integral design of the apparatus and the intimate contact of the heat exchange fluid with the end cap, as well as the cleaning advantages of a design having a removable cover sleeve.

The heat exchange apparatus is not limited in any way by the material of which it is made, although a material with a good thermal conductivity would be preferred. Neither is the apparatus limited by the heat exchange fluid which might be used; water, glycol, water/glycol mixtures or any of the commercially available high efficiency heat exchange fluids would be suitable. Using the heat exchange apparatus of this invention on LPCVD equipment, it is possible to run the furnace in the range of 800° to 900° C. yet keep the end caps at 15° to 150° C. to prevent premature deterioration of the O-rings.

It is also apparent that the concept of longitudinally divided heat exchanger fluid channels could be adapted to geometries other than cylinders, such as flat panels, for example. The base sleeve 34 and the cover sleeve 44 need not have a cylindrical configuration nor a circular cross-section to fall within the scope of this invention. A heat exchange apparatus with a different overall cross-section and design would also be acceptable.

What is claimed is:

1. A high temperature LPCVD reactor assembly having a heat exchanger end cap for cooling O-rings contained thereby, the assembly comprising:
   a hollow, cylindrical quartz reactor tube having two opposite ends;
   at least one furnace heating element at least partially surrounding the quartz reactor tube;
   a heat exchanger end cap on each end of the quartz reactor tube, each end cap comprising:
      a cylindrical base sleeve comprising:
         an inner cylindrical surface having at least one O-ring groove for sealing the heat exchanger end cap tightly with the quartz reactor tube; and
         an outer cylindrical surface having formed therein a circumferential heat exchange fluid channel having a rectangular cross-section, wherein the circumferential heat exchange fluid channel comprises:
            an inlet portion;
            an outlet portion; and
            a sinuous heat exchange fluid channel between the inlet portion and the outlet portion, the outer-most side of the channel being open to the outside; and
         wherein the circumferential heat exchange fluid channel is positioned along the outer cylindrical surface such that the channel is positioned oppositely and adjacent to the O-ring groove in the inner cylindrical surface to withdraw heat therefrom; and
      a cylindrical outer cover sleeve for fitting over the outer cylindrical surface of the cylindrical base sleeve and sealing the sinuous heat exchange fluid channel, the cylindrical outer cover sleeve having a heat exchange fluid inlet port therethrough for corresponding to the inlet portion and a heat exchange fluid outlet port therethrough for corresponding with the outlet portion; and
      an O-ring in each O-ring groove for sealing the heat exchanger end cap tightly with the quartz reactor tube, the O-ring positioned between the quartz reactor tube and the heat exchanger end cap.

2. The high temperature LPCVD reactor assembly of claim 1 wherein the cylindrical outer cover sleeve in the heat exchanger end cap is removably mountable on the outer cylindrical surface of the cylindrical base sleeve.

3. The high temperature LPCVD reactor assembly of claim 1 wherein the heat exchange end cap fluid channel has a longer edge and a shorter edge and is oriented such that the longer edge of the rectangular channel is parallel to the cylindrical surfaces of the cylindrical base sleeve.

4. A method for cooling and preserving the O-rings sealing a heat exchange assembly between a quartz reactor tube and a heat exchanger end cap, comprising the steps of:
   conducting a LPCVD reaction inside the quartz reactor tube at a temperature in the range of 800° to 900° C.; and
   circulating a heat exchange fluid through a sinuous fluid channel of an end cap comprising:
      a base sleeve having a first surface having the sinuous fluid channel formed therein extending between an inlet portion and an outlet portion, and a second surface having at least one O-ring for sealing tightly against the quartz reactor tube, and wherein the sinuous fluid channel is positioned along the first surface such that the channel is positioned oppositely, in close proximity of and adjacent to the O-ring in the second surface to withdraw heat therefrom; and
      a cover sleeve having at least a first surface of substantially the same cross-section as that of the first surface of the base sleeve so as to substantially seal the fluid channel in an operative position of the sleeves, the cover sleeve having an inlet port and an outlet port extending therethrough so as to align with the inlet and outlet portions, respectively, of the fluid channel in the operative position of the sleeves; and
   drawing heat from the quartz reactor tube past the O-rings positioned between the quartz reactor tube and the end cap and transferring it to the heat exchange fluid.

* * * * *